(12) United States Patent
King et al.

(10) Patent No.: US 9,213,387 B2
(45) Date of Patent: Dec. 15, 2015

(54) SMART METERS, AND SYSTEMS AND METHOD FOR ELECTRICAL POWER RECONNECTION

(71) Applicants: Christopher Slaboszewicz King, Berkeley, CA (US); Larsh Maur Johnson, La Jolla, CA (US)

(72) Inventors: Christopher Slaboszewicz King, Berkeley, CA (US); Larsh Maur Johnson, La Jolla, CA (US)

(73) Assignee: eMeter Corporation, San Mateo, CA (US)

( * ) Notice: Subject to any disclaimer, the term of this patent is extended or adjusted under 35 U.S.C. 154(b) by 346 days.

(21) Appl. No.: 13/675,132

(22) Filed: Nov. 13, 2012

(65) Prior Publication Data

US 2013/0123997 A1  May 16, 2013

Related U.S. Application Data

(60) Provisional application No. 61/629,065, filed on Nov. 14, 2011.

(51) Int. Cl.
| | |
|---|---|
| *G06F 19/00* | (2011.01) |
| *G06F 1/30* | (2006.01) |
| *G01D 4/00* | (2006.01) |
| *G01R 22/10* | (2006.01) |
| *H02J 3/14* | (2006.01) |
| *H02J 13/00* | (2006.01) |

(Continued)

(52) U.S. Cl.
CPC *G06F 1/30* (2013.01); *G01D 4/004* (2013.01); *G01R 22/10* (2013.01); *H02H 3/24* (2013.01); *H02H 3/247* (2013.01); *H02H 3/46* (2013.01); *H02J 3/14* (2013.01); *H02J 13/0013* (2013.01); *H02H 1/043* (2013.01); *Y02B 70/3225* (2013.01); *Y02B 90/242* (2013.01); *Y04S 20/222* (2013.01); *Y04S 20/322* (2013.01); *Y04S 20/36* (2013.01)

(58) Field of Classification Search
CPC ............. G06F 1/30; H02J 3/14; Y04S 20/222
USPC ....................................................... 700/295
See application file for complete search history.

(56) References Cited

U.S. PATENT DOCUMENTS 4,511,979 A * 4/1985 Amirante ...................... 700/296
4,780,910 A * 10/1988 Huddleston et al. .......... 398/109

(Continued)

FOREIGN PATENT DOCUMENTS

| EP | 0044181 A1 | 1/1982 |
| WO | 8202954 A1 | 9/1982 |
| WO | 03014748 A1 | 2/2003 |

OTHER PUBLICATIONS

PCT International Search Report mailed Feb. 20, 2013 corresponding to PCT International Application No. PCT/US2012/064959 filed Nov. 14, 2012 (11 pages).

*Primary Examiner* — Michael D Masinick

(57) ABSTRACT

An electrical power system having an electricity meter connected to power lines on one side and a load on the other side, the electricity meter having a processor and memory, a communications module, a sensor, and a service disconnect switch. The system has a communications and control system adapted to send information to the electricity meter and receive information from the electricity meter. The service disconnect switch is locally operable based on a preprogrammed time delay stored in the memory of the electricity meter to restore power in a controlled fashion following a power outage. Electricity meters and electricity reconnection methods are described, as are other aspects.

27 Claims, 7 Drawing Sheets

(51) Int. Cl.
*H02H 3/24* (2006.01)
*H02H 3/247* (2006.01)
*H02H 3/46* (2006.01)
*H02H 1/04* (2006.01)

(56) References Cited

U.S. PATENT DOCUMENTS

| | | | |
|---|---|---|---|
| 5,696,695 A | 12/1997 | Ehlers | |
| 5,790,392 A * | 8/1998 | Eklund et al. | 363/49 |
| 6,088,659 A | 7/2000 | Carpenter | |
| 7,046,682 B2 | 5/2006 | Ardalan | |
| 7,545,135 B2 | 6/2009 | Anderson | |
| 8,005,576 B2 | 8/2011 | Rodgers | |
| 8,260,470 B2 | 9/2012 | Forbes, Jr. | |
| 8,700,224 B2 * | 4/2014 | Mathiowetz | 700/295 |
| 2003/0042794 A1 * | 3/2003 | Jarrett, Jr. | 307/23 |
| 2005/0134120 A1 * | 6/2005 | Nguyen et al. | 307/43 |
| 2005/0134430 A1 | 6/2005 | Ahmad | |
| 2006/0077605 A1 | 4/2006 | Benmouyal | |
| 2006/0187600 A1 * | 8/2006 | Brown et al. | 361/71 |
| 2006/0202858 A1 | 9/2006 | Anderson | |
| 2008/0129538 A1 | 6/2008 | Dresselhuys | |
| 2008/0258709 A1 | 10/2008 | Shuey | |
| 2009/0167021 A1 * | 7/2009 | Andersen | 290/44 |
| 2011/0066297 A1 * | 3/2011 | Saberi et al. | 700/287 |
| 2011/0106327 A1 | 5/2011 | Biyik | |
| 2012/0126793 A1 | 5/2012 | Hemminger | |
| 2013/0123997 A1 * | 5/2013 | King et al. | 700/292 |
| 2013/0123998 A1 * | 5/2013 | King et al. | 700/292 |

* cited by examiner

SMART METERS, AND SYSTEMS AND METHOD FOR ELECTRICAL POWER RECONNECTION

RELATED APPLICATIONS

This application claims priority to U.S. Provisional Patent Application Ser. No. 61/629,065 filed on Nov. 14, 2011, and entitled "SYSTEM FOR SMART METER RECONNECTION," the disclosure of which is hereby incorporated by reference in its entirety herein.

FIELD

The present invention relates generally to systems having electricity meters, and more particularly to systems having electricity meters that record consumption for use in billing retail electricity customers and have a built-in service disconnect switch.

BACKGROUND

The reading of electricity meters has been traditionally accomplished by human meter readers who traveled to the sites and manually read each electricity meter. Traditional electricity meters have not contained any means for remotely disconnecting the service.

More recently, many utilities have begun installing smart electricity meters that have the ability to communicate bi-directionally between the meter and a utility data center. This provides the ability to remotely read the meter. In addition, many of these "smart" meters have an internal service disconnect switch that can be used to disconnect, limit or reconnect the customer's load from a remote location, via a control signal sent by a communications network. The remote disconnection may be accomplished when customers are delinquent or when tenants change in apartments (e.g., in apartments), for example.

Although such remote connection and disconnection offers advantages, in certain circumstances, reconnection can be problematic. Accordingly, smart meters that alleviate problems associated with certain reconnection conditions are sought after.

SUMMARY

According to a first aspect, an electrical power system is provided. The electrical power system includes an electricity meter connected to power lines on one side and a load on the other side, the electricity meter having a meter housing, a processor, a memory, a communications module, a sensor, and a service disconnect switch secured within a meter housing; and a communication and control system configured and adapted to communicate with the electricity meter to accomplish delayed power reconnection.

According to another aspect, an electricity meter is provided. The electricity meter system includes a meter housing containing a processor, a memory configured to a store a time delay, a communications module, a sensor configured to sense power availability, and a service disconnect switch operable responsive to a signal from the processor to close the service disconnect switch after the time delay.

According to a further aspect, an electricity reconnection method is provided. The electricity reconnection method includes providing an electricity meter having a processor, a memory adapted to store a time delay, a communications module, a sensor, and a service disconnect switch, the electricity meter being connected between a load and power lines; sensing power availability on the power lines with the sensor; and after sensing sufficient power availability, reconnecting the power after the time delay.

Still other aspects, features, and advantages of the present invention may be readily apparent from the following detailed description by illustrating a number of example embodiments and implementations, including the best mode contemplated for carrying out the present invention. The present invention may also be capable of other and different embodiments, and its several details may be modified in various respects, all without departing from the scope of the present invention. Accordingly, the drawings and descriptions are to be regarded as illustrative in nature, and not as restrictive. The invention is to cover all modifications, equivalents, and alternatives falling within the scope of the invention.

DESCRIPTION

Figure 1:
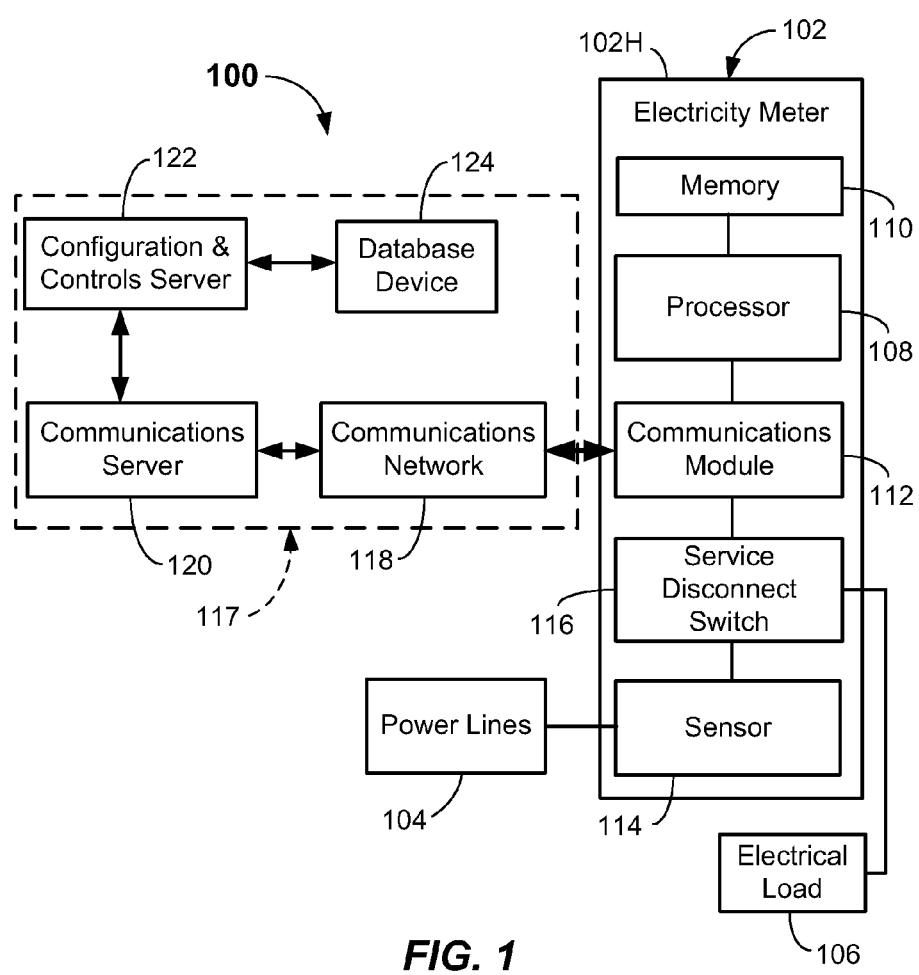
FIG. 1 illustrates a block diagram of an electrical power system having an electricity meter with a service disconnect switch with connections to the power line and electrical load and which utilizes a communication system to provide controlled power reconnection according to embodiments.

Traditionally, when power is restored after an outage, a surge of power rushes through the power distribution grid. This is because the large majority of devices that were turned on at the time of the outage still remain in the on position. So when grid power is restored, all of those "on" devices immediately begin consuming electricity. These power surges cause problems on the distribution grid, such as overloading grid components such as transformers and circuits. These overloaded devices, in turn, sometimes fail as a result of such electricity surges, possibly causing additional distribution grid outages. These subsequent failures increase utility costs by requiring additional repairs and/or replacement of failed devices. In addition, these surges can damage sensitive electronic equipment at customer sites, also causing failures and added expense.

Conventional smart electricity meters with a built-in disconnection/reconnection switch (hereinafter "disconnect switch") have been implemented to aid in remote disconnect/reconnect for addressing delinquent customers or changing tenants. However, during restoration of a distribution grid power outage, such existing electricity meters with disconnect switches stay closed during an outage, and have thus also allowed electricity to flow from the utility's distribution grid to the customer premise through the meter when the power is restored. Thus, existing systems, even those having a disconnect switch, suffer from the same problem of post-restoration power surges.

Embodiments of the invention solve two separate but related problems faced by electric utilities or other electricity providers and the end users of that electricity. First, embodiments of the invention provide a safe means of restoring power following an area power outage, while minimizing power surges. In particular, power may be restored in a controlled fashion by reconnection of the electricity meters other than all at once. Second, embodiments of the invention provide a means of safely reconnecting a customer having customer-site electrical power generator (e.g., solar, wind, water, fuel cell, or other power generation) after a distribution grid power outage, thus preserving the integrity of the local distribution power grid during the power restoration process.

According to one aspect, embodiments of the present invention would allow for locally-controlled reconnection based upon stored information, such as a time delay. The time delay may be programmed and stored in the memory of the electricity meter. As a result, following a distribution grid power outage and subsequent power restoration, electricity meters in a local area would be able to turn on sequentially or randomly after the time delay (e.g., over a time period). Thus, electrical load may be added to the utility power grid other than all at once, i.e., in a controlled fashion such as in increments (e.g., in a random, gradual, or stepwise fashion).

According to another broad aspect, embodiments of the present invention may protect the reliability and integrity of the utility power distribution grid. After a power outage, customers that use customer-site electrical power generation devices such as solar panels (photovoltaic systems), wind power generators, water power generators, fuel cells, or other types of electrical power generating devices may have operating frequencies that begin to deviate from a desired frequency (60 Hz) in the power being generated. Moreover, the phase of the AC signal may deviate over time. If the frequency and/or phase are not properly synchronized with the grid frequency and grid phase when the power is reconnected, power grid disturbances may result. These power grid disturbances, much like power surges, can cause equipment failures and may result in associated costs for repair or replacement.

Currently, some control devices of customer-site electrical power generators (e.g., solar photovoltaic inverters and automatic generation controllers) include the internal capability to synchronize the frequency of the generators with the frequency of the power grid. However, having the electricity meter provide this synchronization capability can help reduce the cost of such photovoltaic inverters and automatic generation controllers, and, thus, promote greater availability of customer-site electrical power generation devices.

To synchronize the customer-site electrical power generator with the power grid, the electricity meter may perform several functions. First, the electricity meter may first operate to disconnect the electrical load coupled to the generator from the generator unit. Second, the electricity meter may sense or receive information about a frequency and/or phase of the electricity being delivered from the power grid following restoration and communicate with the customer-site electrical power generator to determine a frequency of power being generated thereby. Using an internal algorithm, a calculation is made by the processor of the electricity meter to determine how much the generation frequency of the generator unit must be changed. The electricity meter may then communicate that information to the customer-site electrical power generator. Then the electricity meter may receive the updated frequency information. When the frequencies are properly synchronized, reconnection of the power grid to the load side of the electricity meter by toggling the service disconnect switch may take place.

To enable such functionality, the electricity meter may, in some embodiments, have a communications module to send signals into the customer's premise via a home area network (HAN) that can be used to communicate with the customer-site electrical power generator. In other embodiments, the communication module of the electricity meter may communicate directly with a generator communication module. Of course, if the customer-site generator (e.g., wind mill, solar panel or panels, gas powered generator, fuel cells, or the like), are operating normally, the electricity meter simply allows electricity to flow from the customer premise to the utility's distribution grid when the on-site generation exceeds on-site consumption.

In one or more embodiments, a system is provided that comprises an electricity meter connected to power lines on one side and a load on the other side, the electricity meter having a processor and memory, a communications module, a sensor (e.g., current or voltage sensor), and a service disconnect switch secured within the meter housing; and a communications and control system configured and adapted to send information and control signals to the electricity meter and receive information from the electricity meter. The communications and control system manages messages sent over the network and may include a communications computer server connected to the communications network to manage such messages, a second controls computer server for initiating control commands and other information to be sent to the electricity meter, and receiving status of the electrical power distribution system from a command center, and a database device adapted to store information about the electricity meter and possibly other devices connected to the load side of the electricity meter.

These and other features and aspects of embodiments of the invention will now be described with reference to FIGS. 1-6 herein.

Now referring to FIG. 1, an electrical power system 100 is shown. The electrical power system 100 includes an electricity meter 102 connected by electrical input terminals to electrical power lines 104 (e.g., electrical power utility lines) on one side of the electricity meter 102 and by electrical output terminals to an electrical load 106 on the other side of the electricity meter 102. The electrical load 106 may be connected through a panelboard or load center containing circuit breakers or other switching devices that are electrically connected to the load side electrical output terminals of the electricity meter 102, for example. Electrical load 106 may be provided by any electricity consuming article or appliance, such as lights, heating, refrigerator, stove, air conditioning, or other electricity consuming devices. The power lines 104 may include conventional single phase (e.g., A and B phase) power lines. Services may range from 50 A to 400 A, for example. In other embodiments, three phase power (including A, B, and C phases) may be provided.

The electricity meter 102 has a meter housing 102H that is of a suitable shape and that is configured and adapted to contain the internal components of the electricity meter 102. The housing 102 may be any suitable shape that is adapted to house and secure the internal components. Housing 102H may be plastic and may be injection molded. Contained and secured within the housing 102H may be a processor 108 such as an ARM microprocessor, a memory 110, a communications module 112, a sensor 114 (e.g., a current or voltage sensor), and a service disconnect/reconnect switch (hereinafter "service disconnect switch" 116) adapted to connect or disconnect electrical power to or from the load 106, and whose detailed function and structure will be described herein below.

The electrical power system 100 also includes a communication and control system 117 (shown dotted), which may include a communications network 118 operable and adapted to send information and control signals to the electricity meter 102, and which may also receive information and signals from the electricity meter 102. The communication network 118 may communicate with the communications module 112 via two-way communication, both sending and receiving communication signals containing data and/or information. Signals sent may include time delay data and/or information (e.g., time delay values or time delay ranges). Signals received may be verification signals that the communication has properly taken place. Communication and control system 117 may also include a communications server 120 connected to the communications network 118 and operational and adapted to manage messages (e.g., data and/or information) sent over the communications network 118. The communication and control system 117 may also include a second computer acting as a configuration and controls server 122 for initiating control commands and other data and/or information to be sent to the electricity meter 102. The controls and configuration server 122 may be coupled to a database device 124, such as another computer server having a database configured to store information about the electricity meter 102. The database device 124 may be large enough to contain information about thousands or even millions of electricity meters like electricity meter 102.

In particular, the database of the database device 124 may be used to store time delay data and information that is programmed into the memory 110 of each electricity meter 102 for use in carrying out an automatic power reconnection scheme. The scheme operates to reconnect various electrical meters (like electricity meter 102) to the grid at different times, such that electrical loads 106 coupled to the utility grid are reconnected over a period of time rather than all at once. In particular, each electricity meter 102 carries out a delayed power reconnection after a predetermined time delay has elapsed, or at a random time during the time delay if electricity meter 102 is so configured. Reconnection may occur as soon as the time delay has elapsed, at the random time, or within a period of time thereafter, as will be apparent from the following.

The configuration and controls server 122 may have suitable internal software and programming that is operable to automatically synchronize the time delay data and/or information (e.g., minimum time delay values or time delay periods (e.g., ranges)) between the database of data/information stored in the database device 124 and the memory 110 of the various electricity meters (like electricity meter 102). The synchronization occurs by sending messages containing the delay data and/or information over the communications network 118 via any suitable communication protocol. This may be followed by receiving an affirmation signal affirming receipt of the data. The delay data and/or information may be sent in message packets via the communications network 118 to the electricity meter 102. The electricity meter 102 will update the information in its memory 110 and send a communication signal back to the controls and configuration server 122 to verify that the initial communication signal has been received and the configuration in the electricity meter 102 updated. Configuration and controls server 122 may be a computer able to carry out communication with the communications network, such as a communications server that typically includes communications network management, messaging controls, and other elements of the communications protocol utilized to conduct and verify communications between the Controls and Configuration server 122 and the electricity meter 102.

Thus, for each electricity meter 102, the memory 110 stores a time delay for use in reconnecting the electrical load 106 after a distribution grid outage is restored. Subsequent power restoration and reconnection takes place after the time delay has elapsed. In particular, power restoration may occur following a presence of sufficient electrical power being sensed by the sensor 114 (e.g., by a current, voltage, or frequency sensor and circuit). The sensor 114 may sense a voltage in the power lines 104 to determine that power has been restored to a sufficient level, which may be a level within a threshold range established by regulators. For example, for typical single phase service in the U.S., the voltage threshold may be set between 114 and 126 volts. As well, the sensor 114 may sense a frequency of the power lines 104 to determine that it has been restored to a sufficient level, which may be a level within a threshold range established by regulators. For example, the frequency may be 50 Hz, +/−1.0%, i.e. between 49.5 Hz and 50.5 Hz. Optionally, the sensor 114 may sense current to determine that power has been restored to a sufficient level. Any suitable sensing circuit within the electricity meter 102 may be used to sense these values.

The time delay for each meter 102 is further stored in the database of the database device 124 of the communication and control system 117 which may be located at a utility data center, for example. The database device 124 may be large server adapted to contain information about the meter, possibly loads connected, average power consumption data, and the like. Synchronization of the time delay values is provided and maintained via the communications network 118 carrying out data communication between the electricity meter 102 and communications server 120. In turn, the communications server 120 operates as a computer head end connected to the configuration and controls server 122 and database device 124. In some embodiments, the configuration and controls server 122 and database device 124 may reside in one computer. The time delays stored in memory 110 at each electricity meter 102 can also be changed by communicating the changed or updated configuration via the communications network 118 from the control server 120.

In more detail, the service disconnect switch 116 may be operable locally by signals from the processor 108 via preprogrammed instructions stored in the memory 110 of the electricity meter 102 and that have been received from the communications network 118 in order to reconnect the electrical load 106 to the power lines 104 according to a predetermined scheme. The service disconnect switch 116 may be a solenoid or other suitably actuated electrical contact device having at least one moveable electrical contact that is operable to automatically reconnect the electrical load 106 to the electrical power lines 104, as commanded by signals from the processor 108.

In one or more embodiments of the invention, the electricity meter 102 is operable to automatically disconnect the electrical load 106 after sensing a distribution grid outage and automatically reconnect after subsequent restoration thereof. The service disconnect switch 116 may be first actuated upon sensing a lack of power in the power lines 104 due to a power outage. The service disconnect switch 116 may be, for example, a normally-opened switch, such that loss of power to the switch actuator holding the contacts closed results in opening of the service disconnect switch 116 via a spring bias or other biasing force causing the electrical contacts to separate. Thus, disconnection may be an automatic process that may take place upon encountering a loss of power on the power lines 104. In other embodiments, disconnection may be accomplished by actuation of an actuator (solenoid or the like) actuating the service disconnect switch 116.

Reconnection may be accomplished after sensing sufficient power on the power lines 104. In particular, in one embodiment, the sensing may be accomplished by a suitable sensor 114, such as current, frequency sensor or voltage sensor and suitable sensing circuitry. Sensor 114 may be any suitable transformer device and may comprise a coil surrounding the power lines 104, and/or taps on the power lines coupled to a suitable sensing circuit. Sensor 114 and sensing circuit may be operational to sense and provide an output signal to the processor 108 which may be compared to a threshold value stored in memory 110 to determine if sufficient restoration of electrical power has occurred in the power lines 104. For example, once a current, frequency or voltage value sensed by a sensing circuit of the electricity meter 102 meets pre-established criteria for a suitable length of time, such as being within a pre-established threshold range for longer than an initial sampling period, say 16 ms or more, then it may be determined that sufficient power is available for a safe reconnection. Once sufficient power is present, reconnection may take place immediately, or following an additional time delay. In some embodiments, the service disconnect switch 116 may be actuated to reconnect the power from power lines 104 to the electrical load 106 after the additional time delay has elapsed. The service disconnect switch 116 is operably connected to the load 106 and power lines 104, and when actuated, the service disconnect switch 116 changes from a disconnected state to a connected state. The actuation is initiated by an actuation signal received from the processor 108. An appropriate drive circuit including digital to analog (D/A) conversion and/or amplification may be provided to drive the switch actuator that is coupled to or part of the service disconnect switch 116.

However, as stated above, in accordance with an aspect of the invention the actuation signal to the service disconnect switch 116 may be typically sent following a time delay. The time delay may be set differently for different electricity meters, such that electricity meters (like electricity meter 102) that are located on a particular part of the power grid may not reconnect all at the same time. This minimizes power surges. The actuation signal may be provided following a time delay after sufficient grid power is sensed on the power lines 104. The time delay for the electricity meter 102 is previously communicated to the electricity meter via the communication network 118 and is stored in the memory 110. Memory 110 may be any suitable type of memory, such as nonvolatile memory (e.g., Read-Only Memory (ROM)). The ROM may be electrically erasable programmable read only memory (EEPROM), flash memory, or other like changeable memory.

The computer processor 108 may be any suitable processor or microprocessor that is adapted to, and capable of, receiving data in digital form from the sensor circuitry coupled to the sensor 114, executing any number of programmed instructions including time delays, and sending actuation signals to the service disconnect switch 116 to reconnect the power lines 104 to the electrical loads 106. The computer processor 108 may be an ARM processor, such as a 32-bit reduced instruction set computer (RISC) microprocessor developed by Advanced RISC Machines, Ltd. Other microprocessors may be used.

The communication module 112 may be used to communicate with the communications network 118 of the communication and control system 117 (shown dotted). For example, in one embodiment, the communications module 112 may be a wireless communication device, such as a radio frequency (RF) device. Communication may take place between 400 MHz and 5 GHz. Other communication frequencies may be used.

Figure 3A:
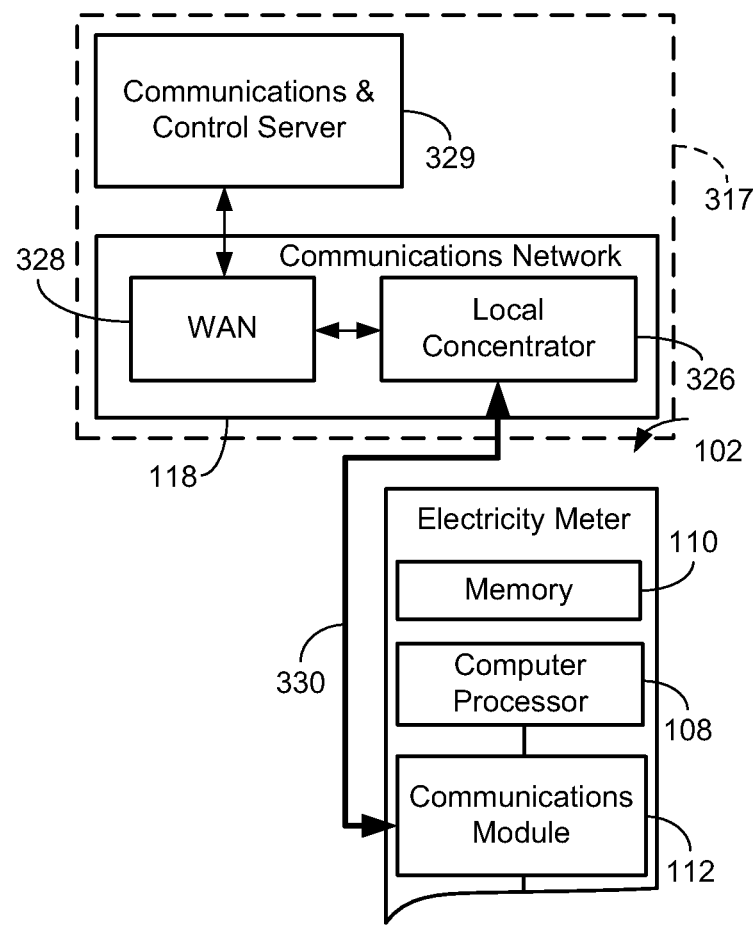
FIG. 3A illustrates a block diagram of a communication and control system that is operative to interface and communicate with an electricity meter according to embodiments.

In one embodiment shown in FIG. 3A, the communication module 112 may be used to communicate with the communications network 118 of a communication and control system 317 (shown dotted). For example, in some embodiments, the communications module 112 may be a Zigbee module adapted to wirelessly communicate with a local concentrator 326 or other node of a smart grid of a utility via wireless (e.g., RF) communication signals 330. Other wireless devices and protocols may be used, such as RF mesh. The local concentrator 326 may communicate with a wide area network (WAN) 328, which may then communicate with a communications and control server 329. Communications and control server 329 may include the functions of the previously-described for the communications server 120, configuration and controls server 122, and database device 124. Together, the communications module 112 and the local concentrator 326 may make up a wireless local area network (WLAN). The time delay information may be communicated via any suitable WLAN and WAN. In some embodiments, individual time delay values may be communicated to each electricity meter 102 on the grid. In other embodiments, several electricity meters may receive a common time delay value, or a common delay period (time range). For example, all electricity meters in communication with a certain communication node may all receive the same delay information, whereas adjacent communication nodes may receive different delay information. In this instance, small local parts of the power grid may be controlled in a way to carry out phased power reconnection. Accordingly, power surges are avoided.

Figure 3B:
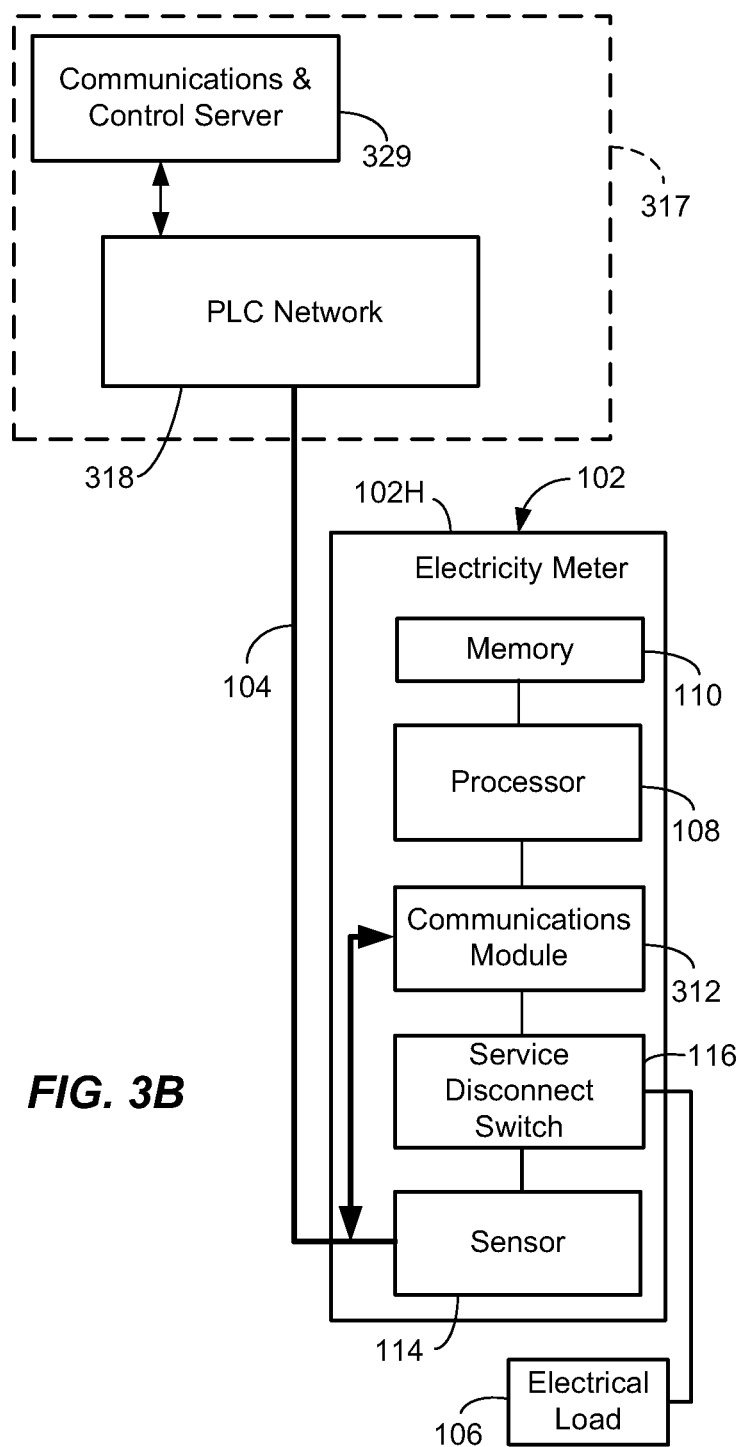
FIG. 3B illustrates a block diagram of another communication and control system that is operative to interface and communicate with an electricity meter according to embodiments.

In other embodiments, as shown in FIG. 3B, the communication module 312 may communicate with a power line communication network 318 via power line communication (PLC) or via broadband over power line (BPL) where the communication signal including the delay data and/or information is carried over one or more of the power lines 104. In yet further embodiments, communication network 118 may be a cellular network, where the communications module 102 communicates with a cell tower and the messages are communicated via optical fiber through the local phone system carrier to accomplish data communication between the communications server 120 and the electricity meter 102. Other types of wired or wireless data communication may be used in the WAN, including, but not limited to, 3G, LTE, and WI-MAX.

Figure 2:
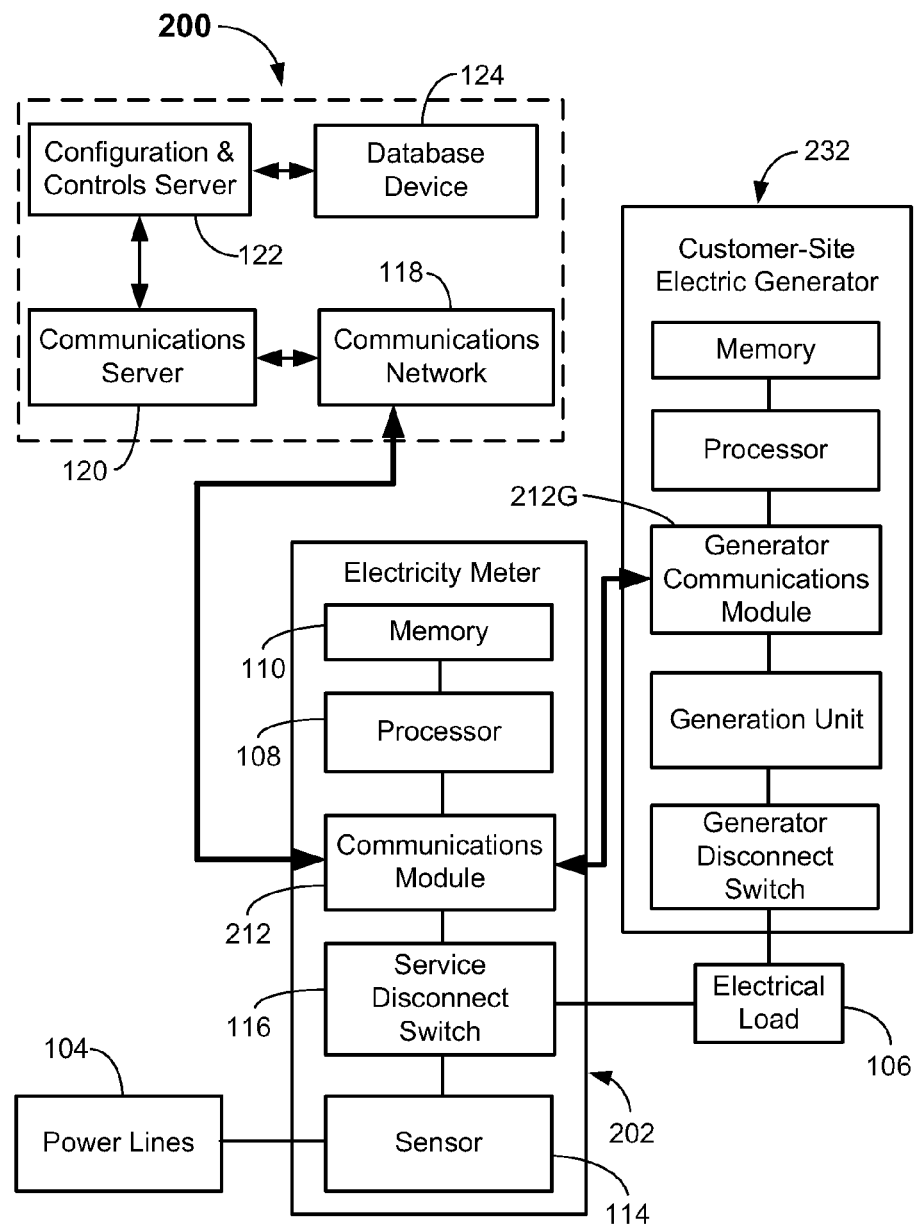
FIG. 2 illustrates a block diagram of an electrical power system that includes an electricity meter having a service disconnect switch connected to a customer-site electric generator according to embodiments.

In FIG. 2, another embodiment of the invention is shown. In this embodiment, an electrical power system 200 may include an electricity meter 202, similar to the electricity meter 102 previously described. The electricity meter 202 not only communicates with the communication network 118, but that also communicates with a customer-site generation device 232. In this embodiment, the electricity meter 202 has the ability to send information to the customer-site generation device 232 and receive information from the customer-site generation device 232. In one feature of the invention, the electricity meter 202 operates to provide communication signals containing information to automatically synchronize a frequency of the customer-site generation device 232 and a frequency of the distribution grid following a distribution grid outage and after sensing subsequent restoration of power.

Upon the electricity meter 202 sensing such an event and when sufficient power from the distribution grid is restored (via current, frequency, or voltage sensing), the electricity meter 202 operates to send a signal (e.g., a message or information packet) to the customer-site generation device 232 with the frequency of the power on the distribution grid. Phase information may also be sent. The customer-site generation device 232 than adjusts its generation frequency automatically and confirms the adjustment and synchronization with electricity meter 202. Upon receipt of this confirmation by the electricity meter 202, the service disconnect switch 116 is actuated to change from the disconnected state to the connected state.

In more detail, the communications module 212 of the electricity meter 202 is configured to communicate with a communications module 212G of the customer-site electrical power generator 232 on a load side of the electricity meter 202, receive a message from the communications module 212G indicating the generator electrical frequency (fg) of an output of the customer-site electrical power generator 232, and automatically reconnect an electrical load 106 only when the generator electrical frequency (fg) is between an upper frequency bound (fu) and a lower frequency bound (fl) stored in the memory 110 of the electricity meter 202. For example, the upper bound may be +5% from the frequency of the power utility grid (fpu). The lower bound may be −5% from the frequency of the utility grid (fpu). Thus, reconnection of the electrical load 106 to the electrical lines 104 may occur via toggling the service disconnect switch 116 upon achieving a generator frequency (fg) that is +/−5% of the frequency of the power utility grid (fpu). Other values may be used such as +/−10%, +/−15%, or more. Also, the phase of the generator phase (pg) should be within limits of the power utility grid phase (ppu). For example, the generator phase (pg) may be within about +/−18 degrees phase from the power utility grid phase (ppu). Other upper frequency bound (fu) and lower frequency bounds (fl) may be used. In some embodiments, the frequency bounds are set in memory 110 and used to test for both sufficient frequency on the power lines 104 of the power utility grid (fpu) and also sufficient generator electrical frequency (fg) of the customer-site electrical power generator 232.

The communications module 212G may any suitable type of module adapted to communicate with the communications module 212 of the utility meter 202. For example, the communications module 212G may be a Zigbee module and may communicate wirelessly via RF. In some embodiments, the communications module 212 of the electricity meter 212 may communicate with a home area network (HAN) which may communicate with the communications module 212G of the customer-site electrical power generator 232 in either via wired (e.g., CAT 5e) or wirelessly.

The values of the upper frequency bound (fu) and the lower frequency bound (fl) of the electricity meter 202 are also stored in a database device 124 of the communication and control system 117 wherein the upper frequency bound (fu) and the lower frequency (fl) bound are synchronized between the electricity meter 202 and the database device 124 via messages sent over the communications network 118 to the electricity meter 202. Any of the communication methods discussed above may be used.

In each of the above-described embodiments, the service disconnect switch 116 is operable via signal from the processor 108 to automatically reconnect the load 106 when the power (as determined by measuring a current, frequency, or voltage or both) delivered by the utility grid in the power lines 104 meets pre-established criteria, such as when the measures value falls within a threshold range stored in the memory of the electricity meter 102, 202, and in accordance with a time delay programmed into the memory 110 of the electricity meter 102, 202.

Figure 4:
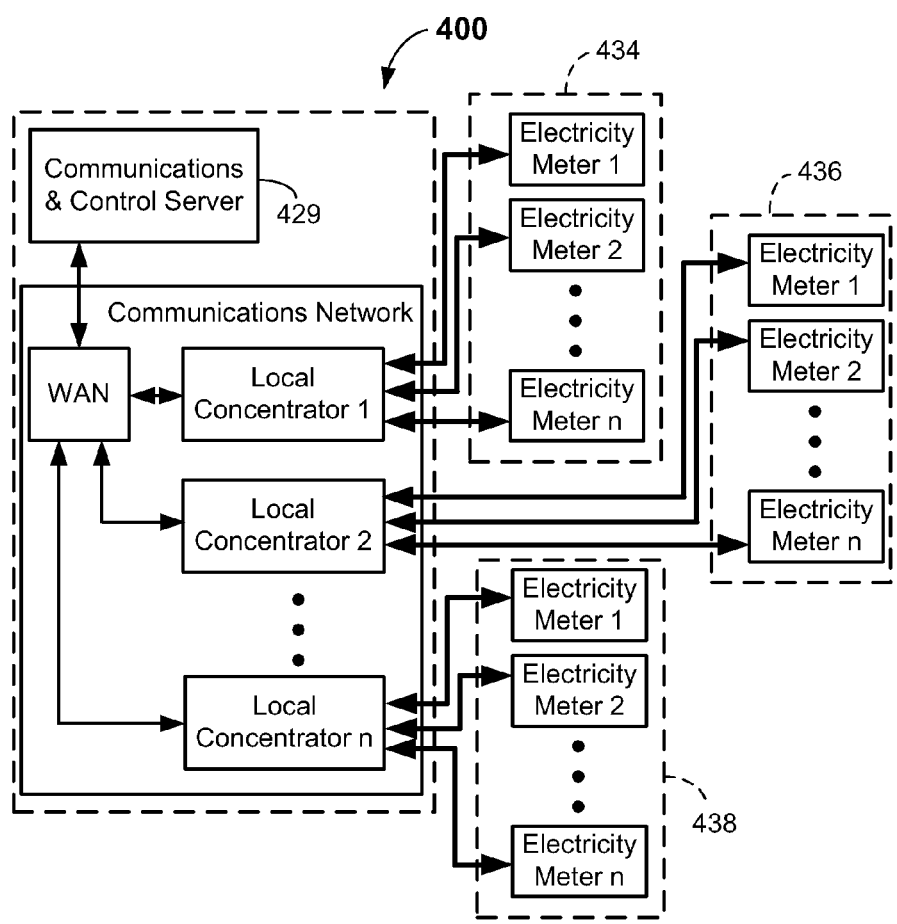
FIG. 4 illustrates a block diagram of an electrical power system that is operative to interface and communicate with a plurality of electricity meters according to embodiments.

FIG. 4 illustrates an electrical power system 400 according to another embodiment of the invention. In this embodiment, the system 400 includes multiple power zones 434, 436, 438. The zones 434, 436, 438 may be in different geographical areas within the overall area serviced by a power grid and may include, tens, hundreds, or even thousands of residences or power consumers per zone. Each zone includes one or multiple electricity meters. For example, first zone 434 may include electricity meters 1 through n. Likewise, zones 436 and 438 may include additional electrical meters 1 through n. Each zone communicates with a local concentrator (e.g., local concentrators 1-n). Each of the local concentrators 1-n then communicates with a WAN, which interfaces and communicates with the communications and control server 429. Communications and control server 429 may be a collection of servers in some embodiments. For example, one or more servers may carry out each of the control, communication, and data storage functions. At least some of the electricity meters for each zone 434, 436, 438 may be meters like electricity meters 102, 202, 302 described herein, i.e., that are electricity meters that allow reconnection to the power grid based upon a time delay.

Several different methodologies may be used to ensure that power surges upon reconnection are avoided. In one aspect, at least some of the electricity meters that are capable of having programmable time delays may be programmed to have a different delay in each zone. Thus, looking at zone 434, some electricity meters 1 through n may be set to have a relatively longer time delays and some may be set to have a relatively shorter time delays. For example, the time delay may be a fixed time delay, such as 2, 3, 4, 5, 10, or 20 seconds. Other time delays may be used. Time delays between about 1 and about 30 seconds may be used in some embodiments. Different fixed time delays may be assigned to different electricity meters 1 through n.

In other embodiments, certain meters within a zone may share the same delay time. The delay time per zone may be selected to bring the loads of that zone onto the power grid at any suitable rate, such as in increments, linearly, non-linearly. For example, the use of meter time delays may be used to bring on all customers in a staged manner within a 30 second period of time. Other periods may be used. In other embodiments, all of the electricity meters 1-n in a zone (e.g., zone 434) may share a same delay time, and the number of zones may be larger. Thus, control may be achieved by assigning each zone to have a generally different length of collective delay. Thus, the time delays may be the same in one zone (e.g., in zone 434), but different in other zones (e.g., in zones 436, 438). Accordingly a first zone (e.g., zone 434), may be brought on all at once, followed by a second zone (e.g., in zone 436), etc. Delays may be the set differently for each meter, or only for some meters. Some meters may share the same time delay. Any suitable combination may be assigned to aid in bringing on load during reconnection in a staged manner. Communication of the delay times may take place as a meter is brought into service or later on. Communication to the electricity meters may take place in a round robin fashion whereas time delay data may be sent to an electricity meter, then to the next, then to the next, and so on. Further, time delay information may be sent to zones. In each case, the time delay information may be sent (e.g., time delay value or range) and a receipt signal may be returned to indicate that the information was received and/or updated in memory. Error information may also be sent.

In some embodiments, where the data sent is a time range, a random number generator may be provided via software stored in memory 110 and operated by processor 108 to generate a delay time within the range. For example, each meter within a zone (e.g., zone 434) may be sent a single tome delay range, and then a random delay time generator may be used to generate a random time within the range. Thus, power within the zone 434 may be brought on in a random manner, but not all at once. In other embodiments, a random time generator may be used to generate a second delay after a fixed delay has elapsed. Any number of schemes may be used to bring on load in any staged manner, whether based upon fixed time delays, time delay ranges, or random time delays, or combinations thereof. Delay settings for any individual electricity meters may be based upon location on the grid, location within a zone, number of meters within the zone, or the like.

Figure 5:
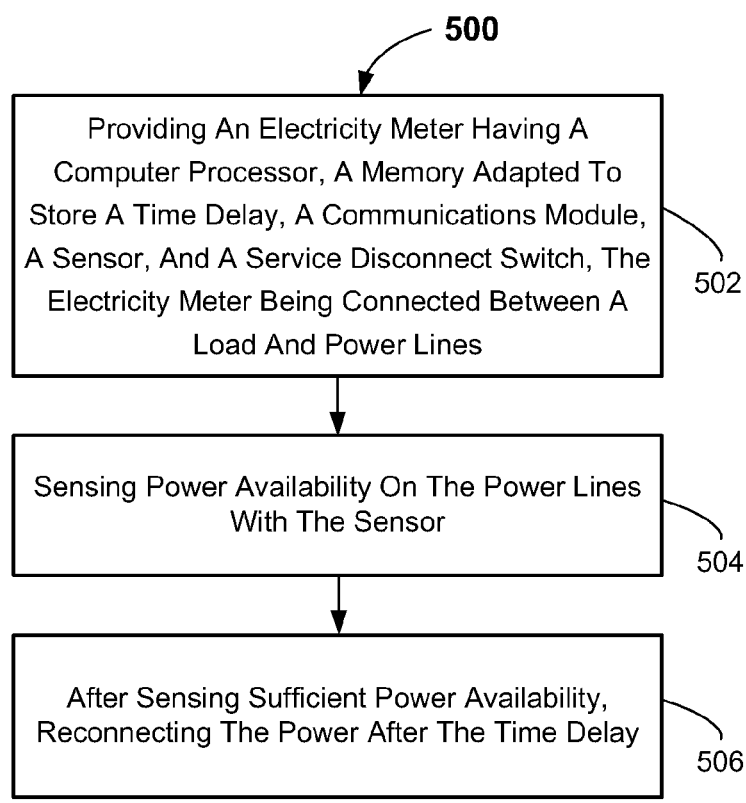
FIG. 5 illustrates a flowchart of a method of operating an electrical power system according to embodiments.

Now referring to FIG. 5, an electricity reconnection method 500 according to one or more embodiments is described. The method 500 includes, in block 502, providing an electricity meter (e.g., electricity meter 102, 202) having a processor (e.g., processor 108), a memory (e.g., memory 110) which is adapted to store a time delay, a communications module (e.g., communications module 112, 212, 312), a sensor (e.g., sensor 114), and a service disconnect switch (e.g., service disconnect switch 116), the electricity meter (e.g., electricity meter 102, 202) being connected between a load (e.g., electrical load 106) and a power lines (e.g., power lines 104). The delay time may be a time after sensing sufficient power is available on the power lines 104 according to the sensed parameters (e.g., voltage, current, or a combination of both) being above a pre-established threshold. The method 500 includes, in block 504, sensing power availability on the power lines with the sensor. The method 500 includes, in block 506, after sensing sufficient power availability, reconnecting the power after the time delay. Thus in some embodiments, reconnection does not occur immediately after sensing sufficient power in present on the power lines, but only some time delay has elapsed. Thus, load is not brought online all at once. Further, in another aspect, certain electrical devices may be protected from exposure to low voltages in that reconnection may not be allowed until certain thresholds are met. Sensing power availability may be accomplished by measuring with a sensor 114 coupled to one or more of the power lines 104 current, voltage, power (via measuring current and resistance or voltage and current), or frequency.

Figure 6:
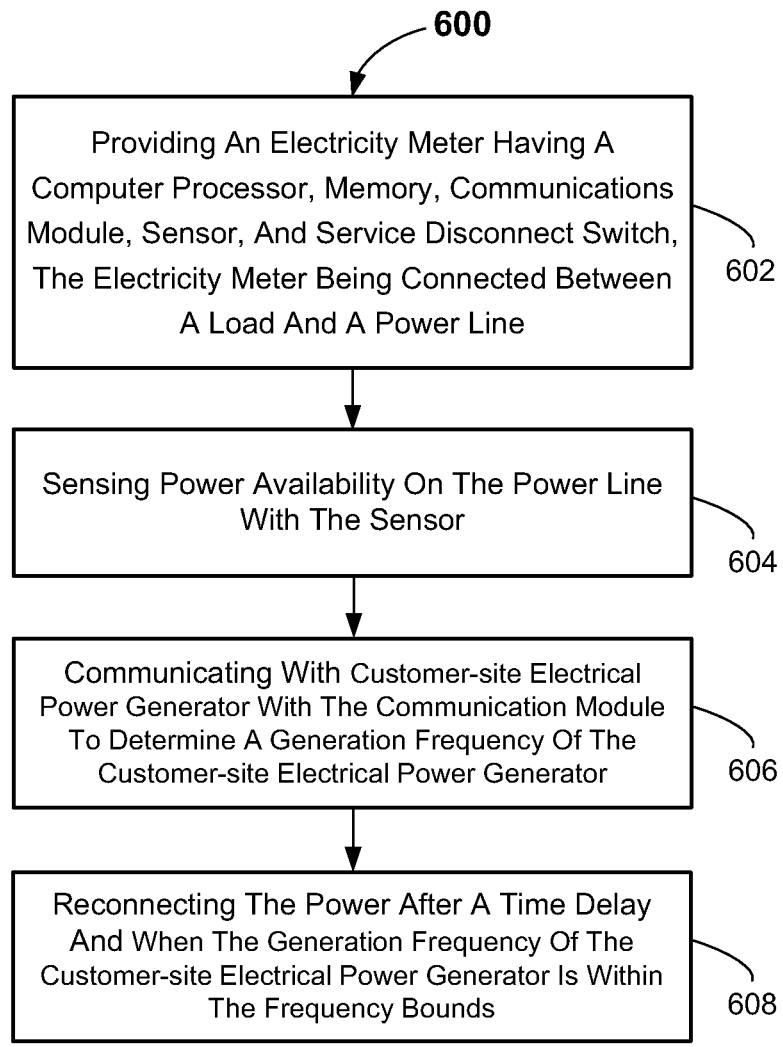
FIG. 6 illustrates a flowchart of another method of operating an electrical power system according to embodiments.

Now referring to FIG. 6, an electricity reconnection method 600 according to one or more embodiments is described. The method 600 includes, in block 602, providing an electricity meter (e.g., electricity meter 202) having a processor (e.g., processor 108), a memory (e.g., memory 110) which is adapted to store a time delay, a communications module (e.g., communications module 212), a sensor (e.g., sensor 114), and a service disconnect switch (e.g., service disconnect switch 116), the electricity meter (e.g., electricity meter 202) being connected between a load (e.g., electrical load 106) and a power lines (e.g., power lines 104). The delay time may be a time after sensing sufficient power is available on the power lines 104 according to the sensed parameters (e.g., voltage, current, or a combination of both) being above a pre-established threshold. The method 600 includes, in block 604, sensing an availability of power on the power lines. Again, sensing of sufficient power availability on the power lines 104 may be by sensing one or more parameters (e.g., voltage, current, or a combination of both). The method 600 includes in block 606, communicating with customer-site electrical power generator (e.g., customer-site electrical power generator 232) with the communication module to determine a generation frequency (e.g., generation frequency fg)) of the customer-site electrical power generator. In block 608, the power is reconnected (e.g., via actuation of service disconnect switch 116) after a time delay, and when the generation frequency of the customer-site electrical power generator is within the frequency bounds (e.g., between upper bound (fu) and lower bound (fl). Reconnection should also be based on the phase of the customer-site electrical power generator being within limits of the utility power phase.

While the invention is susceptible to various modifications and alternative forms, specific embodiments and methods thereof have been shown by way of example in the drawings and are described in detail herein. It should be understood, however, that it is not intended to limit the invention to the particular apparatus, systems, or methods disclosed, but, to the contrary, the intention is to cover all modifications, equivalents and alternatives falling within the scope of the invention.

What is claimed is:

1. An electrical power system, comprising:
   an electricity meter connected to power lines on one side and a load on another side, the electricity meter having
      a meter housing,
      a processor,
      a memory,
      a communications module,
      a sensor, and
      a service disconnect switch secured within a meter housing; and
   a communication and control system of a utility configured and adapted to communicate with the communications module of the electricity meter to accomplish delayed power reconnection of the load through the electricity meter to the power lines after a time delay stored in memory of the electricity meter.

2. The electrical power system of claim 1 wherein the delayed power reconnection is after a predetermined time delay has elapsed.

3. The electrical power system of claim 1 wherein the communication and control system of the utility comprises:
   a communications network for sending information and control signals to the electricity meter and receiving information from the electricity meter;
   a communications computer server connected to the communications network to manage messages sent over the network;
   a controls computer server for initiating control commands and other information to be sent to the electricity meter; and
   a database device configured to store information about the electricity meter, the database storing time delays programmed into each electricity meter for use in automatic reconnection.

4. The electrical power system of claim 3 wherein the controls computer server is operational to automatically synchronize time delay values between the database device and the memory in the electricity meter by sending messages over the communications network.

5. The system of claim 1 wherein the electricity meter stores a time delay in the memory, and actuates the service disconnect switch after the time delay has elapsed to initiate automatic power reconnection between the power lines and load through the electricity meter.

6. The system of claim 1 wherein the electricity meter stores a time delay period in the memory, and actuates the service disconnect switch at a time within the time delay period to initiate automatic power reconnection actuates the service disconnect switch after the time delay has elapsed to initiate automatic power reconnection between the power lines and the load through the electricity meter.

7. The system of claim 1 wherein the service disconnect switch operates automatically to reconnect the load through the electricity meter to the power lines at a random time after a delay time stored in the memory of the electricity meter.

8. The system of claim 1 wherein the service disconnect switch operates automatically to reconnect the load through the electricity meter to the power lines at a random time within a delay period stored in the memory of the electricity meter.

9. The system of claim 1 wherein the communications module of the electricity meter is configured to
   communicate with a customer-site electrical power generator on a load side of the electricity meter;
   receive a message indicating a generator electrical frequency of an output of the customer-site electrical power generator;
   sense frequency on the power lines on a line side of the electricity meter; and
   automatically reconnect a load only when the frequency of both the customer-site electrical power generator and the power line is between an upper frequency bound and a lower frequency bound stored in the memory of the electricity meter.

10. The system of claim 9 wherein values of the upper frequency bound and the lower frequency bound of the electricity meter are also stored in a database device of the communication and control system wherein the upper frequency bound and the lower frequency bound are synchronized between the electricity meter and the database device via messages sent over a communications network to the electricity meter.

11. The system of claim 1 wherein the service disconnect switch is operable to automatically reconnect the load when a voltage on the power lines is within a threshold range stored in the memory of the electricity meter, and in accordance with the time delay programmed into the memory of the electricity meter.

12. The system of claim 1 wherein the service disconnect switch operates to reconnect the load through the electricity meter after a time delay following sensing sufficient voltage on the power lines.

13. The system of claim 1 wherein the sensor comprises a current, frequency, or voltage sensor.

14. An electricity meter, comprising:
   a meter housing containing
      a processor,
      a memory configured to a store a time delay for reconnection,
      a communications module,
      a sensor configured to sense power availability, and
      a service disconnect switch operable responsive to a signal from the processor to close the service disconnect switch after the time delay and reconnect power to a load through the electricity meter after the time delay.

15. The electricity meter, of claim 14, wherein
   the memory is configured to a store frequency bounds; and
   the service disconnect switch is operable responsive to a signal from the processor to close the service disconnect switch after the time delay, when a generation frequency of a customer-site electrical power generator is within the frequency bounds, and when a generation frequency of power lines are within the frequency bounds.

16. An electricity reconnection method, comprising:
   providing an electricity meter having a processor, a memory storing a time delay for reconnection of the electricity meter, a communications module, a sensor, and a service disconnect switch, the electricity meter being connected between a load and power lines;
   sensing power availability on the power lines with the sensor; and
   after sensing sufficient power availability, reconnecting the power to the load through the electricity meter after the time delay.

17. The method of claim 16 wherein the reconnecting comprises actuating the service disconnect switch after the time delay has elapsed to initiate automatic power reconnection between the load and the power lines through the electricity meter.

18. The method of claim 16 wherein the reconnecting comprises actuating the service disconnect switch at a time within a time delay period to initiate automatic power reconnection between the load and the power lines through the electricity meter.

19. The method of claim 18 wherein the reconnecting comprises actuating the service disconnect switch to reconnect power between the load and the power lines through the electricity meter at a random time within the time delay period.

20. The method of claim 16, wherein the reconnecting comprises:
   communicating with a customer-site electrical power generator with the communication module of the electricity meter;
   receiving a message indicating a generator electrical frequency of an output of the customer-site electrical power generator;
   sensing a generation frequency on the power lines of the electricity meter; and
   automatically reconnecting the load when the generator electrical frequency is between an upper frequency bound and a lower frequency bound stored in the memory of the electricity meter, and when the generation frequency of the power lines is within the upper frequency bound and the lower frequency bound.

21. The method of claim 16, wherein sensing sufficient power availability comprises measuring current falling within a current threshold range, measuring frequency falling within a frequency threshold range, or measuring voltage within a voltage threshold range.

22. The method of claim 16, wherein the reconnecting comprises:
   determining a generator electrical frequency of an output of the customer-site electrical power generator;
   determining a generation frequency of the power lines coupled to the electricity meter; and
   automatically reconnecting the load when the generator electrical frequency is between an upper frequency bound and a lower frequency bound stored in the memory of the electricity meter, and when the generation frequency of the power lines is between the upper frequency bound and the lower frequency bound.

23. The method of claim 22, wherein the reconnecting comprises:
   determining a generator phase of the output of the customer-site electrical power generator;

determining a power utility grid phase of the power lines coupled to the electricity meter, and automatically reconnecting the load when the generator phase is within limits of the power utility grid phase.

24. The method of claim 22, wherein the reconnecting comprises:

toggling the service disconnect switch when the generator electrical frequency that is within +/−15% of the generation frequency of the power lines.

25. The method of claim 22, wherein the reconnecting comprises:

toggling the service disconnect switch when a generator phase of the customer-site electrical power generator is within limits of a power utility grid phase of the power lines.

26. The method of claim 25, wherein the reconnecting takes place when the generator phase is within about +/−18 degrees phase from the power utility grid phase.

27. An electrical power system, comprising:

an electricity meter connected to power lines on a line side and a load on a load side, the electricity meter having a meter housing, a processor, a memory, a communications module, a sensor, and a service disconnect switch secured within the meter housing; and a communication and control system of a utility configured and adapted to communicate with the communications module of the electricity meter to accomplish delayed power reconnection of the load through the electricity meter to the power lines after a time delay stored in memory of the electricity meter, wherein the communications module of the electricity meter is configured to:

communicate with a customer-site electrical power generator on the load side of the electricity meter, receive a message indicating a generator electrical frequency and phase of an output of the customer-site electrical power generator, sense the frequency and phase on the line side of the electricity meter, and automatically reconnect when the frequency and phase of both the customer-site electrical power generator and the power lines are within limits stored in the memory of the electricity meter.

* * * * *